US007623338B2

(12) United States Patent
Won

(10) Patent No.: US 7,623,338 B2
(45) Date of Patent: Nov. 24, 2009

(54) MULTIPLE METAL-INSULATOR-METAL CAPACITORS AND METHOD OF FABRICATING THE SAME

(75) Inventor: Seok-jun Won, Seoul (KR)

(73) Assignee: Samsung Electronics Co., Ltd. (KR)

( * ) Notice: Subject to any disclaimer, the term of this patent is extended or adjusted under 35 U.S.C. 154(b) by 322 days.

(21) Appl. No.: 11/343,328

(22) Filed: Jan. 30, 2006

(65) Prior Publication Data

US 2006/0171098 A1  Aug. 3, 2006

(30) Foreign Application Priority Data

Feb. 1, 2005  (KR) .................. 10-2005-0009200

(51) Int. Cl.
*H01G 4/228* (2006.01)
(52) U.S. Cl. ................. 361/306.3; 361/303; 361/321.1; 361/311; 361/328; 361/330; 438/239; 438/240; 438/253; 438/256
(58) Field of Classification Search ................. 361/328, 361/330, 302, 303–305, 311–313, 321.1, 361/321.2, 306.2; 438/239–240, 253, 256; 257/760, 762, 765
See application file for complete search history.

(56) References Cited

U.S. PATENT DOCUMENTS

| 6,277,687 | B1 * | 8/2001 | Agarwal | 438/255 |
|---|---|---|---|---|
| 6,284,590 | B1 * | 9/2001 | Cha et al. | 438/240 |
| 6,337,496 | B2 * | 1/2002 | Jung | 257/295 |
| 6,461,914 | B1 | 10/2002 | Roberts et al. | |
| 6,512,260 | B2 * | 1/2003 | Hsue et al. | 257/306 |
| 6,518,117 | B2 * | 2/2003 | Ping et al. | 438/239 |
| 6,680,521 | B1 * | 1/2004 | Kar-Roy et al. | 257/532 |
| 6,815,328 | B2 * | 11/2004 | Pio | 438/618 |
| 6,933,551 | B1 * | 8/2005 | Stribley et al. | 257/296 |
| 7,307,000 | B2 | 12/2007 | Choi | |
| 2002/0056869 | A1 | 5/2002 | Morimoto | 257/313 |
| 2003/0008468 | A1 | 1/2003 | Park | |
| 2006/0006447 | A1 * | 1/2006 | Kim et al. | 257/308 |
| 2006/0154437 | A1 | 7/2006 | Choi | |

FOREIGN PATENT DOCUMENTS

| JP | 2002-151649 | 5/2002 |
|---|---|---|
| KR | 10-2002-0045270 | 6/2002 |
| KR | 1020020081799 A | 10/2002 |
| KR | 1020050071035 A | 7/2005 |

* cited by examiner

*Primary Examiner*—Nguyen T Ha
(74) *Attorney, Agent, or Firm*—Mills & Onello, LLP

(57) ABSTRACT

In a device including multiple metal-insulator-metal (MIM) capacitors and a method of fabricating the same, the multiple MIM capacitors comprise a lower interconnect in a substrate; a first dielectric layer on the lower interconnect; a first intermediate electrode pattern on the first dielectric layer overlapping with the lower interconnect; a second intermediate electrode pattern on the first dielectric layer and spaced apart from the first intermediate electrode pattern in a same plane of the device as the first intermediate electrode pattern; a second dielectric pattern on the second intermediate electrode pattern; and an upper electrode pattern on the second dielectric pattern.

10 Claims, 7 Drawing Sheets

MULTIPLE METAL-INSULATOR-METAL CAPACITORS AND METHOD OF FABRICATING THE SAME

RELATED APPLICATIONS

This application claims priority from Korean Patent Application No. 10-2005-0009200 filed on Feb. 1, 2005 in the Korean Intellectual Property Office, the disclosure of which is incorporated herein by reference in its entirety.

BACKGROUND OF THE INVENTION

1. Field of the Invention

The present invention relates to multiple metal-insulator-metal (MIM) capacitors and a method of fabricating the same.

2. Description of the Related Art

Semiconductor devices fabricated using BIPOLAR, BICMOS and CMOS technologies require integrated capacitors having high voltage linearity, accurate capacitance values, and low parasitic capacitance. The conventional MOS or MIS capacitors which have been employed to date not only have unsatisfactory voltage linearity on account of voltage-induced space charge regions, but also widely varying parasitic capacitance.

To avoid these limitations, polysilicon-insulator-polysilicon (PIP) capacitors have recently become popular. However, since the PIP capacitors use conductive polysilicon for an upper electrode layer and a lower electrode layer, an oxidation reaction occurs at interfaces between the upper and lower electrodes and the dielectric layer, resulting in the formation of a native oxide film, which can lead to an overall reduction in capacitance. One approach to addressing this problem is to use metal-insulator-metal (MIM) capacitors.

MIM capacitors are used in many mixed-signal (MS) (analog/digital) and radio frequency (RF) circuit applications. An MIM capacitor for mixed-signal applications requires superior VCC and leakage characteristics, and an MIM capacitor for RF applications requires a high quality factor (Q value).

To this end, a dielectric layer of an MIM capacitor used in MS applications is formed to be thicker than that of an MIM capacitor used in RF applications. As a result, the capacitance per unit area of the MIM capacitor for MS applications is higher than that of the MIM capacitor for RF applications. Also, the resistance of an electrode of the MIM capacitor for RF applications requiring a high Q value should be lower than that of the MIM capacitor for MS applications.

In many cases, MIM capacitors requiring those different characteristics should be formed in the same interconnect level of the same device. However, since the thicknesses of dielectric layers of the MIM capacitors are the same in the same interconnect level, the capacitance values per unit area of the MIM capacitors are also the same, causing an unnecessary increase in the thickness of the MIM capacitor for RF applications and thus an increase in the total chip size, which can lead to degradation of the Q value.

SUMMARY OF THE INVENTION

The present invention provides multiple MIM capacitors that are formed in the same interconnect level of a device, and have different capacitance values per unit area.

The present invention also provides a method of fabricating multiple MIM capacitors in the same interconnect level of a device, and having different capacitance values per unit area.

According to an aspect of the present invention, there is provided a device including multiple metal-insulator-metal (MIM) capacitors. The device comprises: a lower interconnect in a substrate; a first dielectric layer on the lower interconnect; a first intermediate electrode pattern on the first dielectric layer overlapping with the lower interconnect; a second intermediate electrode pattern on the first dielectric layer and spaced apart from the first intermediate electrode pattern in a same plane of the device as the first intermediate electrode pattern; a second dielectric pattern on the second intermediate electrode pattern; and an upper electrode pattern on the second dielectric pattern.

In one embodiment, the device further comprises a capping layer pattern covering upper portions of the first intermediate electrode pattern, the second intermediate electrode pattern, and the upper electrode pattern.

In another embodiment, the device further comprises a capping dielectric pattern on the first intermediate electrode pattern that is in a same plane of the device as the second dielectric pattern.

In another embodiment, a dielectric constant of the second dielectric pattern is higher than that of the first dielectric layer.

In another embodiment, the second dielectric pattern is formed of at least one material layer selected from the group consisting of a silicon oxide layer, a silicon nitride layer, a silicon nitric oxide layer, an aluminum nitride layer, an aluminum nitric oxide layer, and a metal oxide layer, and a stack of or a combination of at least one of these layers.

In another embodiment, the metal oxide layer comprises a zirconium oxide (ZrOx) layer, an aluminum oxide (AlOx) layer, a hafnium oxide (HfOx) layer, or a lanthanum oxide (LaOx) layer, or a combination thereof.

In another embodiment, the device further comprises a spacer formed at sidewalls of the upper electrode pattern on the second dielectric pattern.

In another embodiment, the spacer is formed of SiN, SiON, SiO2, AlN, AlON, Al2O3, or a combination thereof.

In another embodiment, the first intermediate electrode pattern, the second intermediate electrode pattern, and the upper electrode pattern are formed of Ti or TiN.

In another embodiment, the first dielectric layer is formed of SiN or AlN, or of a material including SiN or AlN.

According to another aspect of the present invention, there is provided a device including multiple metal-insulator-metal (MIM) capacitors. The device comprises: a first lower electrode pattern on a substrate; a second lower electrode pattern on the substrate spaced apart from the first lower electrode pattern in a same plane of the device as the first lower electrode pattern; a first lower dielectric pattern on the first lower electrode pattern; a second lower dielectric pattern on the second lower electrode pattern; a first intermediate electrode pattern on the first lower dielectric pattern; a second intermediate electrode pattern on the second lower dielectric pattern; an upper dielectric pattern on the second intermediate electrode pattern; and an upper electrode pattern on the upper dielectric pattern.

In one embodiment, the upper dielectric pattern is formed of at least one material layer selected from the group consisting of a silicon oxide layer, a silicon nitride layer, a silicon nitric oxide layer, an aluminum nitride layer, an aluminum nitric oxide layer, and a metal oxide layer, and a stack of or a combination of at least one of these layers.

In another embodiment, the metal oxide layer comprises a zirconium oxide (ZrOx) layer, an aluminum oxide (AlOx) layer, a hafnium oxide (HfOx) layer, a lanthanum oxide (LaOx) layer, or a combination thereof.

In another embodiment, the first lower electrode pattern, the second lower electrode pattern, the first intermediate electrode pattern, the second intermediate electrode pattern, and the upper electrode pattern are formed of Ti or TiN.

In another embodiment, the first lower dielectric pattern and the second lower dielectric pattern are formed of SiN or AlN, or of a material including SiN or AlN.

In another embodiment, a dielectric constant of the upper dielectric pattern is higher than that of the first and second lower dielectric patterns.

According to another aspect of the present invention, there is provided a method of fabricating a semiconductor device including multiple metal-insulator-metal (MIM) capacitors. The method comprises: forming a lower interconnect in a substrate; forming a first dielectric layer on the lower interconnect; forming a first intermediate electrode pattern on the first dielectric layer overlapping with the lower interconnect; forming a second intermediate electrode pattern on the first dielectric layer spaced apart from the first intermediate electrode pattern in a same plane of the device as the first intermediate electrode pattern; forming a second dielectric pattern on the second intermediate electrode pattern; and forming an upper electrode pattern on the second dielectric pattern.

In one embodiment, the method further comprises forming a capping layer pattern to cover the first intermediate electrode pattern, the second intermediate electrode pattern, and the upper electrode pattern after the operation of forming the upper electrode pattern.

In another embodiment, the method further comprises forming a capping dielectric pattern on the first intermediate electrode pattern that is in a same plane of the device as the second dielectric pattern after the operation of forming the second intermediate electrode pattern.

In another embodiment, a dielectric constant of the second dielectric pattern is higher than that of the first dielectric layer.

In another embodiment, the second dielectric pattern is formed of at least one selected material layer selected from the group consisting of a silicon oxide layer, a silicon nitride layer, a silicon nitric oxide layer, an aluminum nitride layer, an aluminum nitric oxide layer, and a metal oxide layer, and a stack of or a combination of at least one of these layers.

In another embodiment, the metal oxide layer comprises a zirconium oxide (ZrOx) layer, an aluminum oxide (AlOx) layer, a hafnium oxide (HfOx) layer, or a lanthanum oxide (LaOx) layer, or a combination thereof.

In another embodiment, the method further comprises forming a spacer at sidewalls of the upper electrode pattern after the operation of forming the second dielectric pattern.

In another embodiment, the spacer is formed of SiN, SiON, SiO2, AlN, AlON, or Al2O3, or a combination thereof.

In another embodiment, the first intermediate electrode pattern, the second intermediate electrode pattern, and the upper electrode pattern are formed of Ti or TiN.

In another embodiment, the first dielectric layer is formed of SiN or AlN or of a material including SiN or AlN.

According to another aspect of the present invention, there is provided a method of fabricating a semiconductor device including multiple metal-insulator-metal (MIM) capacitors. The method comprises: forming a first lower electrode pattern on a substrate; forming a second lower electrode pattern on the substrate spaced apart from the first lower electrode pattern in a same plane of the device as the first lower electrode pattern; forming a first lower dielectric pattern on the first lower electrode pattern; forming a second lower dielectric pattern on the second lower electrode pattern; forming a first intermediate electrode pattern on the first lower dielectric pattern; forming a second intermediate electrode pattern on the second lower dielectric pattern; forming an upper dielectric pattern on the second intermediate electrode pattern; and forming an upper electrode pattern on the upper dielectric pattern.

In one embodiment, the upper dielectric pattern is formed of at least one material layer selected from the group consisting of a silicon oxide layer, a silicon nitride layer, a silicon nitric oxide layer, an aluminum nitride layer, an aluminum nitric oxide layer, and a metal oxide layer, and a stack of or a combination of at least one of these layers.

In another embodiment, the metal oxide layer comprises a zirconium oxide (ZrOx) layer, an aluminum oxide (AlOx) layer, a hafnium oxide (HfOx) layer, or a lanthanum oxide (LaOx) layer, or a combination thereof.

In another embodiment, the first lower electrode pattern, the second lower electrode pattern, the first intermediate electrode pattern, the second intermediate electrode pattern, and the upper electrode pattern are formed of Ti or TiN.

In another embodiment, the first lower dielectric pattern and the second lower dielectric pattern are formed of SiN or AlN or of a material including SiN or AlN.

In another embodiment, a dielectric constant of the upper dielectric pattern is higher than that of the first and second lower dielectric patterns.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF THE INVENTION

Figure 1A:
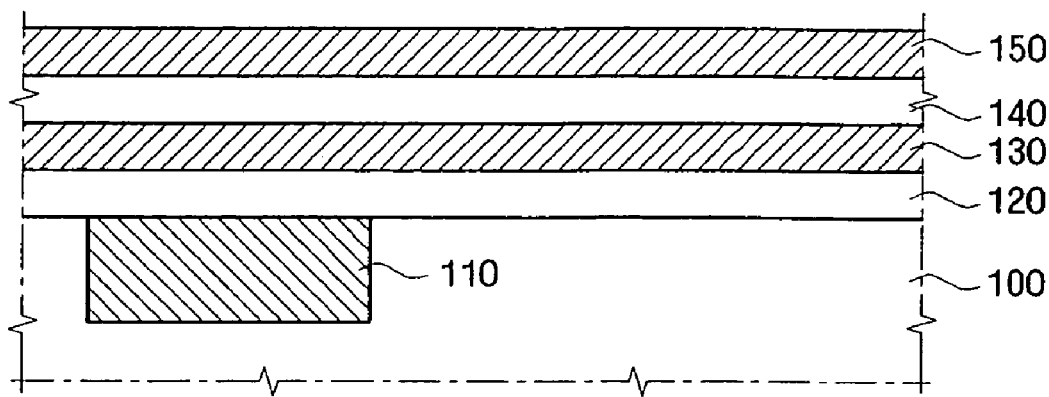
FIGS. 1A through 1D are cross-sectional views illustrating a process of fabricating multiple MIM capacitors and the multiple MIM capacitors fabricated by the process, according to a first embodiment of the present invention.

Advantages and features of the present invention and methods of accomplishing the same can be understood more readily with reference to the following detailed description of preferred embodiments and the accompanying drawings. The present invention may, however, be embodied in many different forms and should not be construed as being limited to the embodiments set forth herein. When a layer is referred to as being "on" another lower layer, the layer may be directly on the lower layer, or intervening layers may be present. Like reference numerals refer to like elements throughout the specification.

FIGS. 1A through 1D are cross-sectional views illustrating a process of fabricating multiple MIM capacitors and the multiple MIM capacitors fabricated by the process, according to a first embodiment of the present invention.

Figure 1B:
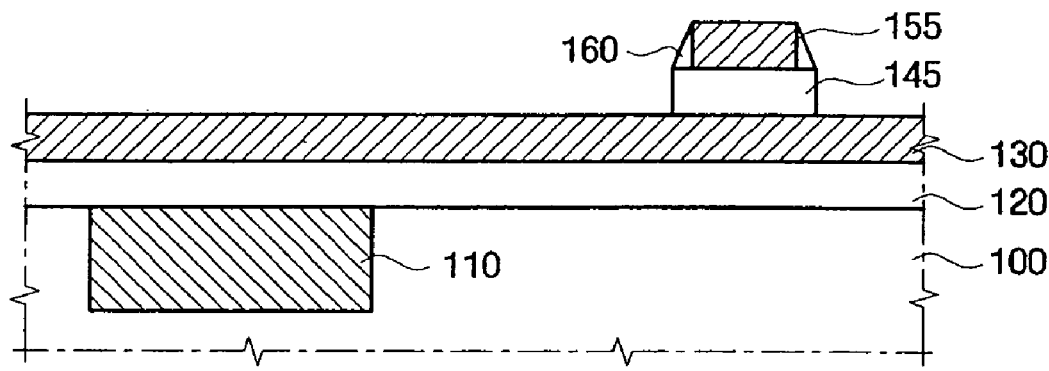
Figure 1C:
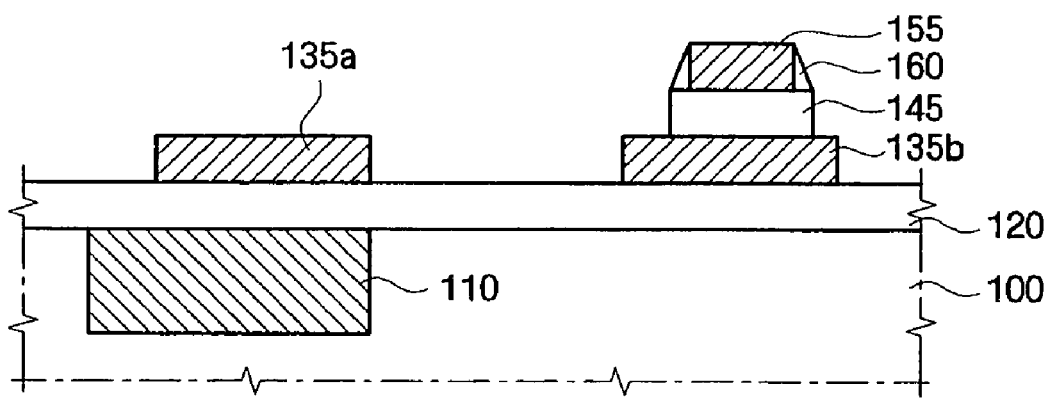
Figure 1D:
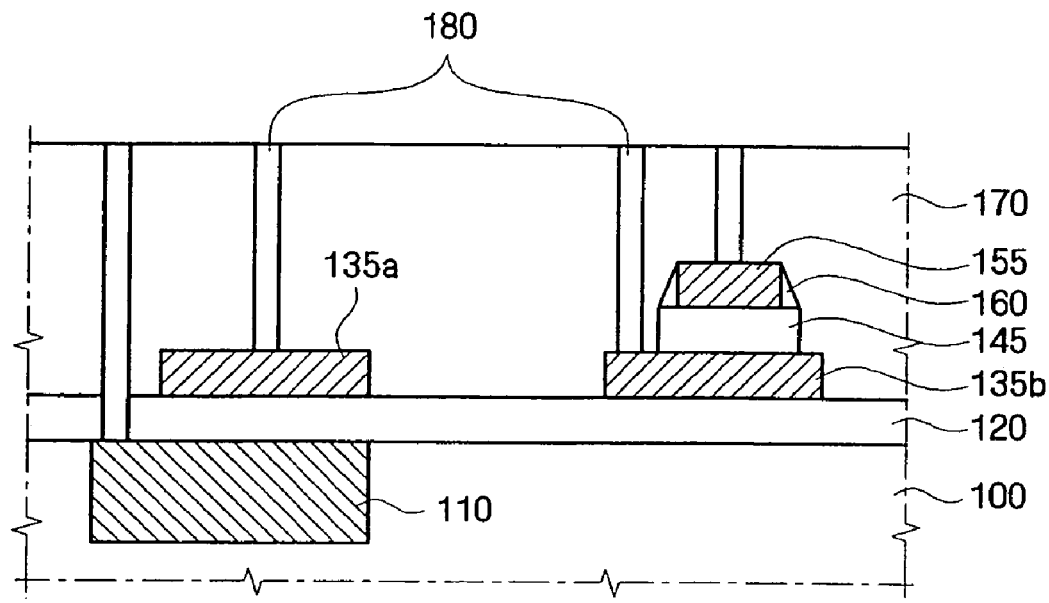

Referring to FIG. 1D, multiple MIM capacitors according to a first embodiment of the present invention includes a first capacitor, a second capacitor, an interlayer insulating layer 170, and a plurality of via contacts 180. The first capacitor includes a lower electrode (interconnect) 110 formed in a substrate 100, a first dielectric layer 120, and a first intermediate electrode pattern 135a. The second capacitor includes a second intermediate electrode pattern 135b, a second dielectric pattern 145, and an upper electrode pattern 155. The interlayer insulating layer 170 is formed on the entire upper surface of structures constituting the first capacitor and the second capacitor. The via contacts 180 are formed in the interlayer insulating layer 170 and expose electrodes of the first capacitor and the second capacitor.

The lower interconnect 110 used as the lower electrode of the first capacitor can be electrically connected to a conductive material included in a semiconductor device.

Here, the lower interconnect 110 is formed of a conductive material, preferably copper (Cu). When the lower interconnect 110 is made of copper (Cu), the first dielectric layer 120 functions as a diffusion barrier for copper (Cu). Materials including SiN, Al2O3, Ta2O5, TiO, HfO2, La2O5, ZrO2, TaON, SrTiO3, (Ba, Sr)TiO3, Pb (Zr, Ti)O3, or (Pb, La) (Zr, Ti)O3 may be used for the first dielectric layer 120. In the first embodiment of the present invention, SiN is used for the first dielectric layer 120 for the purpose of example.

The first intermediate electrode pattern 135a and the second intermediate electrode pattern 135b are formed to be separated from each other in the same plane. It is preferable that the first intermediate electrode pattern 135a be formed on an area of the device overlapping with the lower interconnect 110 and the second intermediate electrode pattern 135b be formed on an area of the device where the lower interconnect 110 is not located. It is also preferable that the first intermediate electrode pattern 135a and the second intermediate electrode pattern 135b are formed of the same material for simplicity of the process, leading to greater manufacturing efficiency.

The second dielectric pattern 145 is formed on top of the second intermediate electrode pattern 135b. The second dielectric pattern 145 is formed of a material having a dielectric constant that is higher than that of the first dielectric layer 120 to maintain a high dielectric constant with respect to the thickness of the dielectric layer. Materials having a high dielectric constant include, among others, silicon oxide, silicon nitride, silicon nitric oxide, aluminum nitride, aluminum nitric oxide, and metal oxide. For the metal oxide, zirconium oxide (ZrOx), aluminum oxide (AlOx), hafnium oxide (HfOx), and lanthanum oxide (LaOx) can be used.

The upper electrode pattern 155 is formed on top of the second dielectric pattern 145. An etch stopper or a non-conductive layer having an anti-reflection coating function may further be formed on top of the upper electrode pattern 155, though not shown.

The first intermediate electrode pattern 135a, the second intermediate electrode pattern 135b, and the upper electrode pattern 155 can be formed, for example, of Ti or TiN.

For etching the second dielectric pattern 145, a spacer 160 may further be formed at sidewalls of the upper electrode pattern 155 on the second dielectric pattern 145. The spacer 160 may be formed, for example, of SiN, SiON, SiO2, AlN, AlON, or Al2O3.

The second dielectric pattern 145 can alternatively be formed by an etching process for the upper electrode pattern 155 using a first photomask, without the need for the spacer 160.

The interlayer insulating layer 170 is formed to provide insulation between metal materials such as the first intermediate electrode pattern 135a, the second intermediate electrode pattern 135b, and the upper electrode pattern 155. The interlayer insulating layer 170 can be formed, for example, using Plasma Enhanced-Tetra Ethyl Ortho Silicate (PE-TEOS), Fluoride Silicate Glass (FSG), Phosphor Silicate Glass (PSG), silicon oxide (SiOx), and so forth. Further, the interlayer insulating layer 170 can optionally be formed using a chemical vapor deposition (CVD) method.

An upper interconnect (not shown) is formed on the upper surface of the interlayer insulating layer 170 processed by chemical mechanical polishing (CMP). The via contacts 180 are formed in the interlayer insulating layer 170 to connect the upper interconnect and the electrode patterns.

It is preferable that the first capacitor using the lower interconnect 110 as the lower electrode be used for RF applications because it can obtain a high Q value and the second capacitor be used for MS applications because it can use a material with a high dielectric constant for its dielectric layer, such as second dielectric pattern 145, though having a low Q value relative to the first capacitor.

Hereinafter, a process of fabricating the multiple MIM capacitors according to the first embodiment of the present invention will be described with reference to FIGS. 1A through 1D.

Referring to FIG. 1A, the first dielectric layer 120, an intermediate electrode layer 130, a second dielectric layer 140, and an upper electrode layer 150 are sequentially staked on the substrate 100 where the lower interconnect 100 is formed. A hard mask for an etching process may further be formed on top of the upper electrode layer 150, though not shown. A material such as SiON, SiN, or Al2O3 may be used for the hard mask.

Referring to FIG. 1B, next, the upper electrode pattern 155 is formed by etching the upper electrode layer 150 using a first photomask. Here, a non-conductive layer is applied after the upper electrode patterning process is stopped on the second dielectric layer 140. The spacers 160 are then formed at the sidewalls of the upper electrode pattern 155 using an etch-back process. The second dielectric pattern 145 is formed by etching the second dielectric layer 140 using the upper electrode pattern 155 and the spacer 160 as an etch mask.

Referring to FIG. 1C, the first intermediate electrode pattern 135a and the second intermediate electrode pattern 135b are then formed by etching the intermediate electrode layer 130 using a second photomask. The first intermediate electrode pattern 135a is formed to overlap with the lower interconnect 110 and the second intermediate electrode pattern 135b is separated from the first intermediate electrode pattern 135a so to be electrically insulated.

Referring to FIG. 1D, next, the interlayer insulating layer 170 is formed for the purpose of insulating metal materials of the first and second intermediate electrode patterns 135a and 135b and insulating the lower layers from subsequently applied upper layers. The via contacts 180 connected to the first and second intermediate electrode patterns 135a and 135b are then formed in the interlayer insulating layer 170.

An upper interconnect (not shown) is formed on the upper surface of the interlayer insulating layer 170 processed by chemical mechanical polishing (CMP).

FIGS. 2A through 2E are cross-sectional views illustrating a process of fabricating multiple MIM capacitors and the multiple MIM capacitors fabricated by the process, according to a second embodiment of the present invention.

Figure 2A:
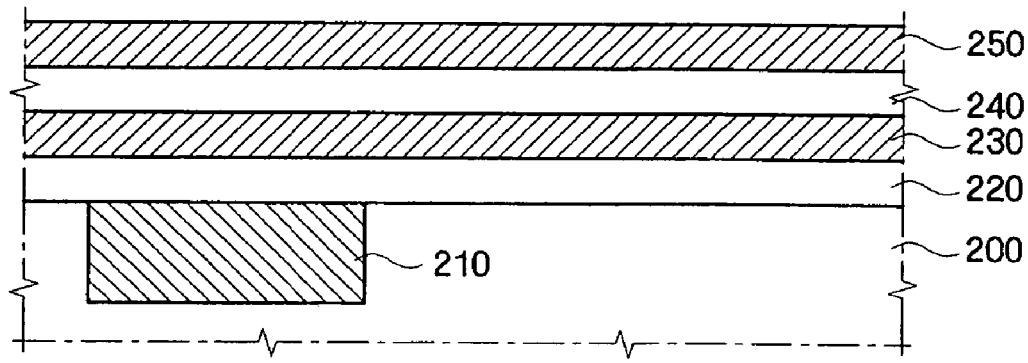
FIGS. 2A through 2E are cross-sectional views illustrating a process of fabricating multiple MIM capacitors and the multiple MIM capacitors fabricated by the process, according to a second embodiment of the present invention.
Figure 2B:
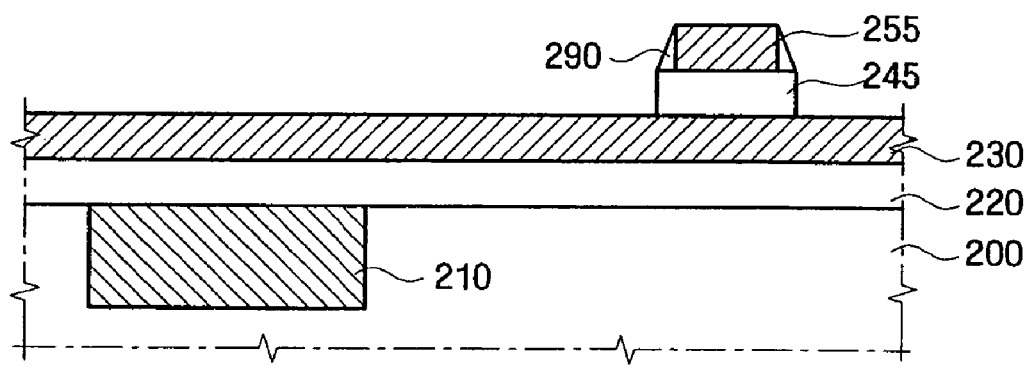
Figure 2C:
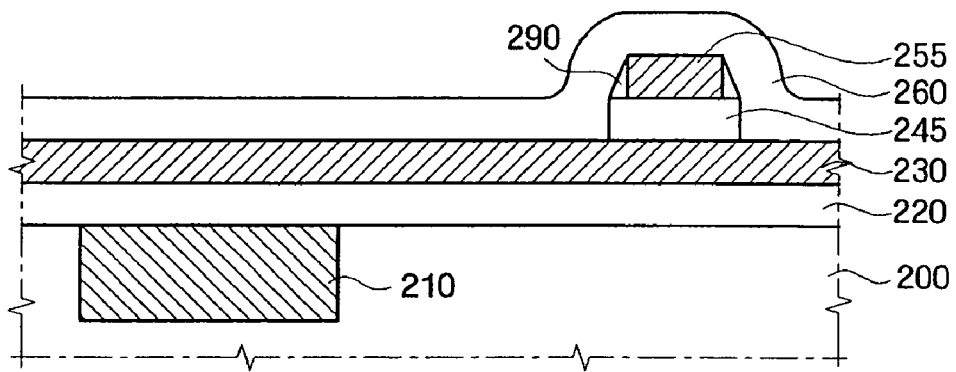
Figure 2D:
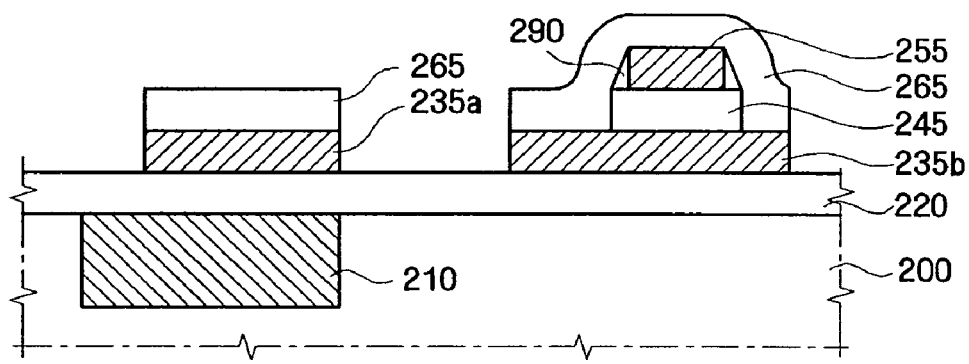
Figure 2E:
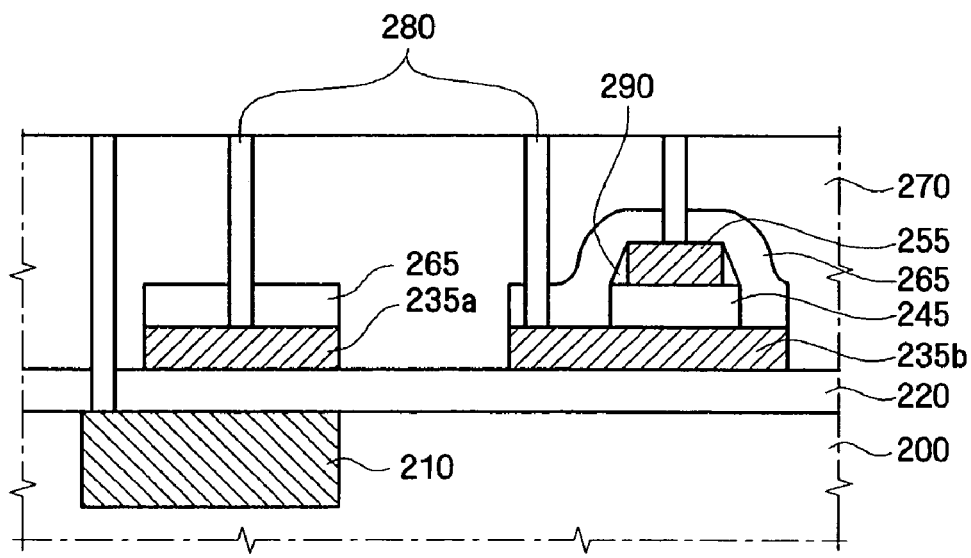

As shown in FIG. 2E, a device including multiple MIM capacitors according to a second embodiment of the present invention includes a lower interconnect 210 that operates as a lower electrode, a first dielectric layer 220, a first intermediate electrode pattern 235a, a second intermediate electrode pattern 235b, a second dielectric pattern 245, an upper electrode pattern 255, and a capping layer pattern 265. In other words, the device including multiple MIM capacitors according to the second embodiment of the present invention further includes the capping layer pattern 265 in addition to the multiple MIM capacitors according to the first embodiment of the present invention shown in FIGS. 1A through 1D.

A process of fabricating the multiple MIM capacitors according to the second embodiment of the present invention will now be described with reference to FIGS. 2A through 2E. For brevity, only differences between the first and second embodiments of the present invention are described.

Referring to FIG. 2A, the first dielectric layer 220, an intermediate electrode layer 230, a second dielectric layer 240, and an upper electrode layer 250 are sequentially stacked on a substrate 200 where the lower interconnect 210 is formed.

Referring to FIG. 2B, next, the upper electrode pattern 255 is formed by etching the upper electrode layer 250 using a first photomask. A spacer 290 is formed at sidewalls of the upper electrode pattern 255 and the second dielectric pattern 245 is formed by etching the second dielectric layer 240 using the spacer 290. Here, it is preferable that the second dielectric pattern 245 has a dielectric constant that is higher than that of the first dielectric layer 220.

Referring to FIGS. 2C and 2D, a capping layer 260 is formed on an exposed top surface of the resulting structure and the capping layer pattern 265 is formed by patterning the capping layer 260. The first intermediate electrode pattern 235a and the second intermediate electrode pattern 235b are formed by etching the intermediate electrode layer 230. At this time, the formed capping layer pattern 265 can be used as a hard mask for etching the intermediate electrode layer 230 without a need for an additional photomask.

Thus, the capping layer pattern 265 functions as a protection layer for a previously-formed second capacitor at the time of an etching process for the formation of a first capacitor. In addition, the capping layer pattern 265 may function as a hard mask and an anti-reflection coating (ARC) for forming the first intermediate electrode pattern 235a and the second intermediate electrode pattern 235b. The capping layer pattern 265 also functions as an etch stopper that prevents the upper electrode pattern 255, the first intermediate electrode pattern 235a, and the second electrode pattern 235b from being etched while etching is performed toward the lower pattern 210 used as the lower electrode of the first capacitor in a process of forming via contacts 280 after the formation of the interlayer insulating layer 270.

Referring to FIG. 2E, after the formation of the first intermediate electrode pattern 235a and the second intermediate electrode pattern 235b is completed, the interlayer insulating layer 270 and the via contacts 280 are formed.

The device including multiple MIM capacitors according to the second embodiment of the present invention includes the spacer 290 at the sidewalls of the upper electrode pattern 255 for etching the second dielectric pattern 245; however, inclusion of the spacer 290 is optional, as described above.

FIGS. 3A through 3D are cross-sectional views illustrating a process of fabricating multiple MIM capacitors and the multiple MIM capacitors fabricated by the process, according to a third embodiment of the present invention.

Figure 3A:
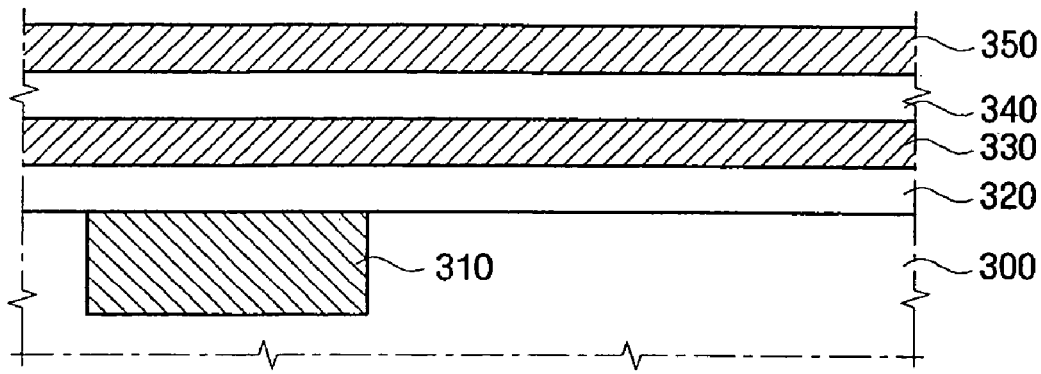
FIGS. 3A through 3D are cross-sectional views illustrating a process of fabricating multiple MIM capacitors and the multiple MIM capacitors fabricated by the process, according to a third embodiment of the present invention.
Figure 3B:
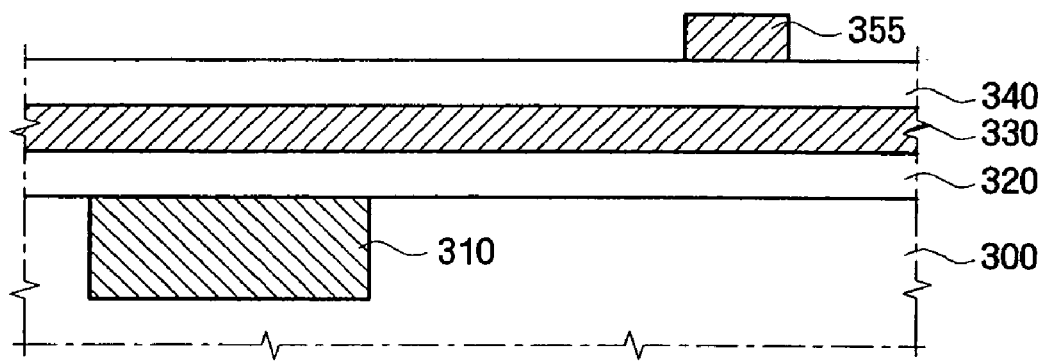
Figure 3C:
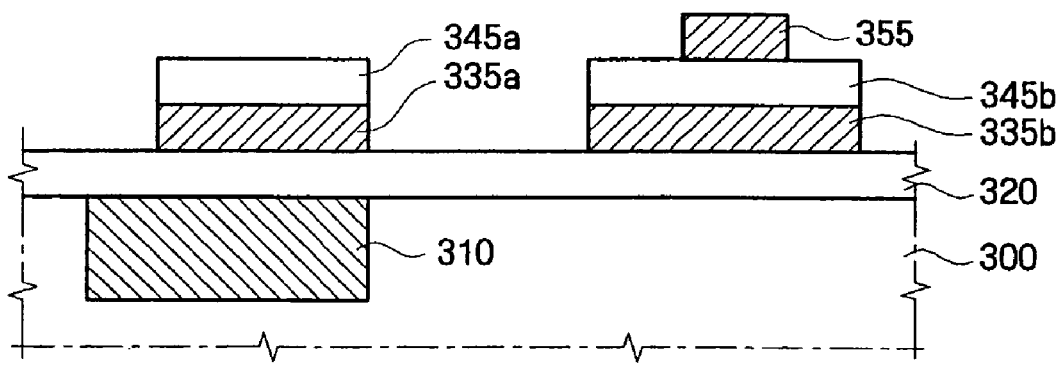
Figure 3D:
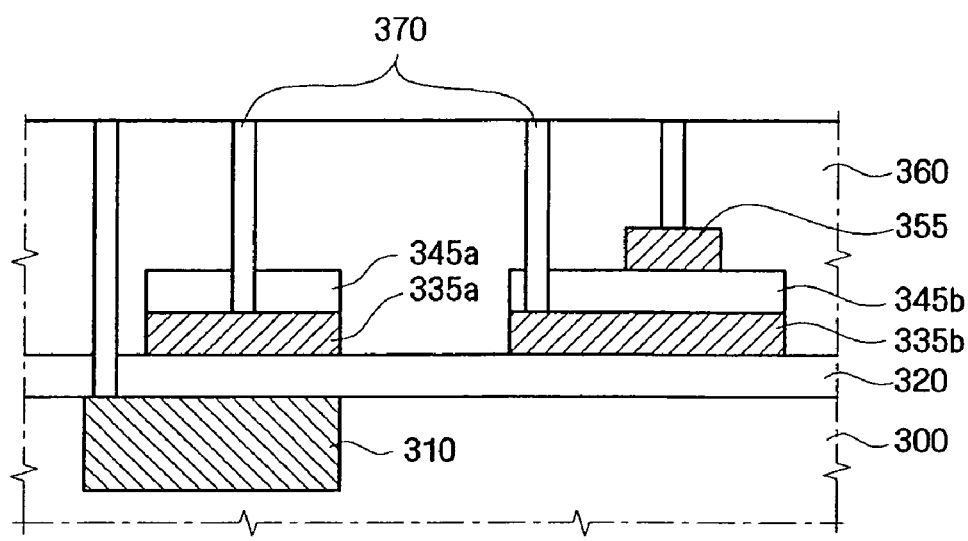

As shown in FIG. 3D, a device including multiple MIM capacitors according to a third embodiment of the present invention includes a lower interconnect 310 that is a lower electrode, a first dielectric layer 320, a first intermediate electrode pattern 335a, a second intermediate electrode pattern 335b, a capping dielectric pattern 345a, a second dielectric pattern 345b, and an upper electrode pattern 355. In other words, the device including the multiple MIM capacitors according to the third embodiment of the present invention further includes the capping dielectric pattern 345a in addition to the multiple MIM capacitors according to the first embodiment of the present invention shown in FIGS. 1A through 1D.

A process of fabricating the multiple MIM capacitors according to the third embodiment of the present invention will now be described with reference to FIGS. 3A through 3D. For brevity, differences between the first and third embodiments of the present invention are described.

Referring to FIG. 3A, the first dielectric layer 320, an intermediate electrode layer 330, a second dielectric layer 340, and an upper electrode layer 350 are sequentially stacked on a substrate 300 where the lower interconnect 310 is formed.

Referring to FIGS. 3B and 3C, next, the upper electrode pattern 355 is formed by etching the upper electrode layer 350 using a first photomask. The first intermediate electrode pattern 335a, the second intermediate electrode pattern 335b, the capping dielectric pattern 345a, and the second dielectric pattern 345b are formed by patterning the second dielectric layer 340 and the intermediate electrode layer 330 using a second photomask.

In the present third embodiment, the capping dielectric pattern 345a is a portion of the second dielectric layer 340 remaining on the first intermediate electrode pattern 335a by simultaneously patterning the second dielectric layer 340 and the intermediate electrode layer 330 after the formation of the upper electrode pattern 355 using an etching process. In other words, when using the processes according to the first and second embodiments of the present invention, after the upper electrode pattern 355 and the second dielectric pattern 345b are formed through a first etching process, the first intermediate electrode pattern 355a and the second intermediate electrode pattern 335b are formed through a second etching process. However, according to the third embodiment of the present invention shown in FIGS. 3A through 3D, the first intermediate electrode pattern 335a and the second electrode pattern 335b are simultaneously formed in the formation of the second dielectric pattern 345b after the upper electrode pattern 355 is formed.

Thus, according to the third embodiment, a device including the multiple MIM capacitors can be more efficiently fabricated by simplifying the fabricating process.

Referring to FIG. 3D, after the formation of the first intermediate electrode pattern 335a and the second electrode pattern 335b is completed, an interlayer insulating layer 360 and via contacts 370 are formed.

As described above, it is preferable that the second dielectric pattern 345b is formed of a material having a dielectric constant that is higher than that of the first dielectric layer 320.

FIGS. 4A through 4E are cross-sectional views illustrating a process of fabricating multiple MIM capacitors and the multiple MIM capacitors fabricated by the process, according to a fourth embodiment of the present invention.

Figure 4A:
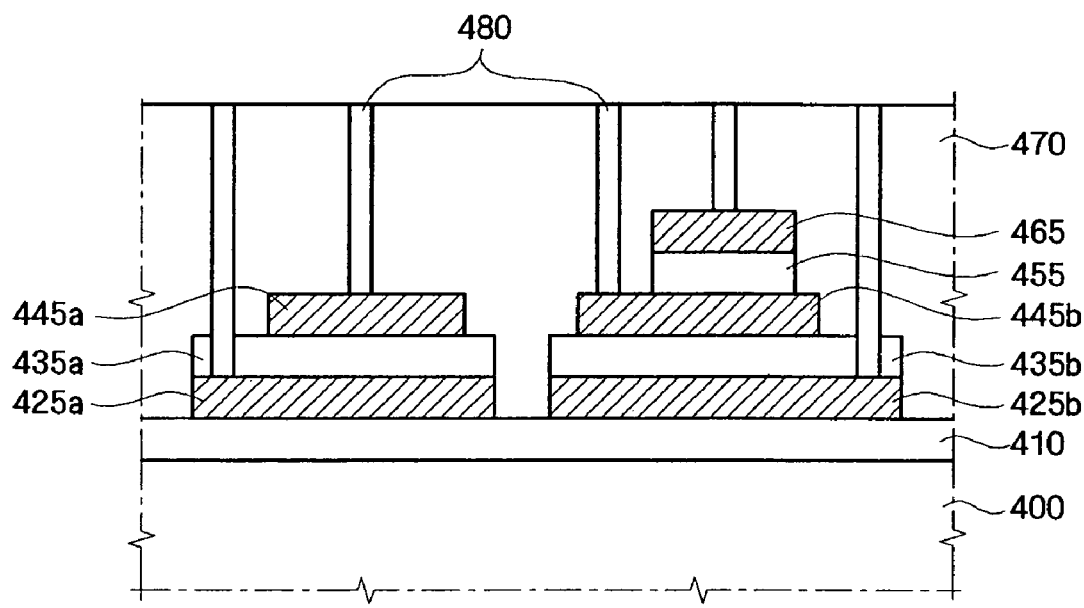
FIGS. 4A through 4E are cross-sectional views illustrating a process of fabricating multiple MIM capacitors and the multiple MIM capacitors fabricated by the process, according to a fourth embodiment of the present invention.

As shown in FIG. 4A, a device including multiple MIM capacitors according to a fourth embodiment of the present invention includes a first lower electrode pattern 425a, a second lower electrode pattern 425b, a first lower dielectric pattern 435a, a second lower dielectric pattern 435b, a first intermediate electrode pattern 445a, a second intermediate electrode pattern 445b, an upper dielectric pattern layer 455, and an upper electrode pattern 465. The device of the fourth embodiment of the present invention includes a first capacitor, a second capacitor, a third capacitor, an interlayer insulating layer 470, and a plurality of via contacts 480. The first capacitor includes the first lower electrode pattern 425a, the first lower dielectric pattern 435a, and the first intermediate electrode pattern 445a. The second capacitor includes the second intermediate electrode pattern 445b, the upper dielectric pattern 455, and the upper electrode pattern 465. The third capacitor is formed between the second lower electrode pattern 435b and the upper electrode pattern 465. The interlayer insulating layer 470 is formed on the entire upper surface of structures constituting the first through third capacitors. The via contacts 480 are formed in the interlayer insulating layer 470 and expose the electrodes of the first through third capacitors.

In this example, a lower interconnect may be formed under an insulating layer 410 formed on a substrate 400 and an upper interconnect may be formed on the interlayer insulating layer 470.

A process of fabricating the multiple MIM capacitors according to the fourth embodiment of the present invention will now be described with reference to FIGS. 4A through 4D.

Figure 4B:
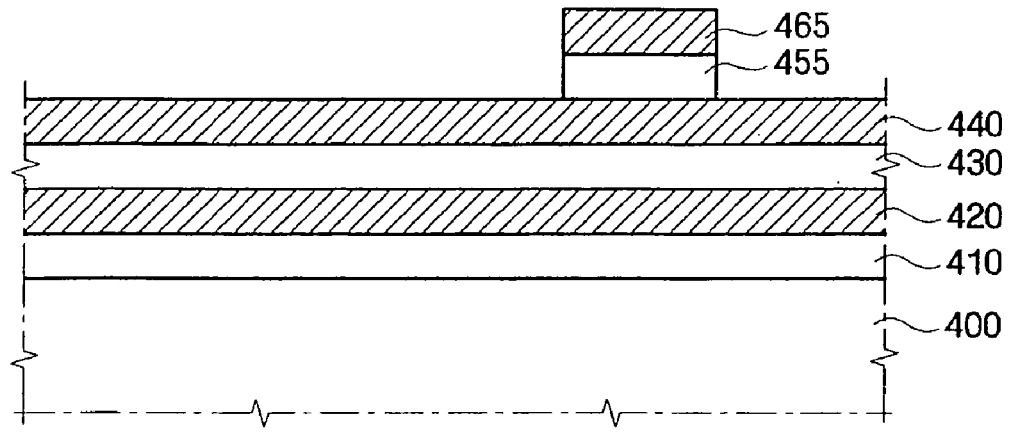
Figure 4C:
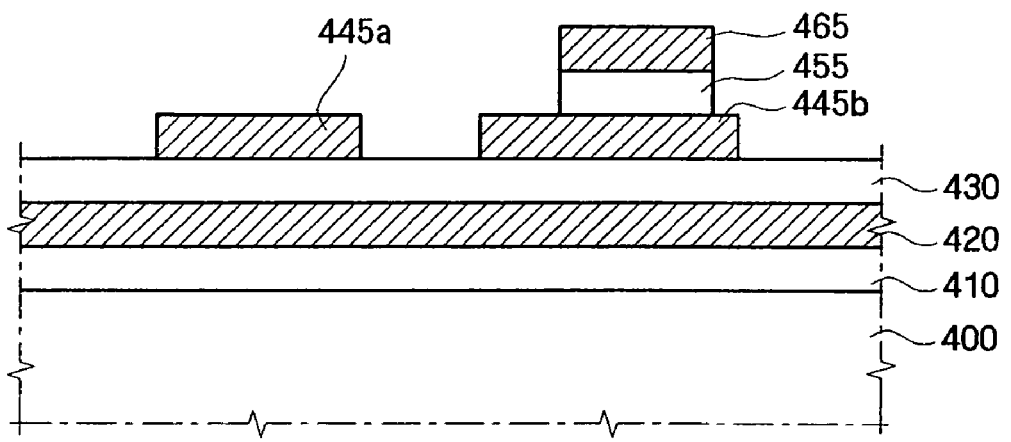
Figure 4D:
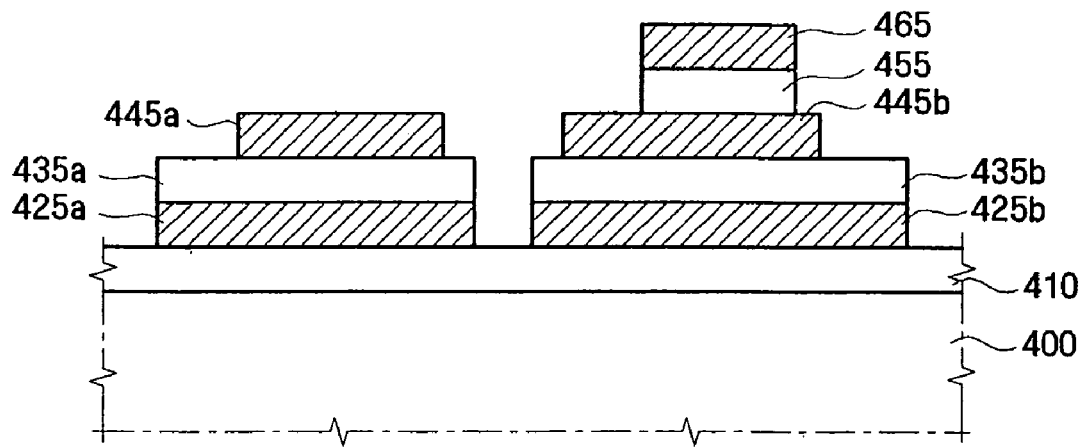

Referring to FIG. 4B, a lower electrode layer 420, a lower dielectric layer 430, an intermediate electrode layer 440, an upper dielectric layer 450, and an upper electrode layer 460 are sequentially stacked on the substrate 400 on which the insulating layer 410 is formed. The upper dielectric pattern 455 and the upper electrode pattern 465 are formed using a first photomask. Referring to FIG. 4C, the first intermediate electrode pattern 445a and the second intermediate electrode pattern 445b are formed using a second photomask. Referring to FIG. 4D, the first lower dielectric pattern 435a, the second lower dielectric pattern 435b, the first lower electrode pattern 425a, and the second lower electrode pattern 425b are formed using a third photomask.

The upper dielectric pattern 455 can alternatively be formed using a spacer, as described above.

Figure 4E:
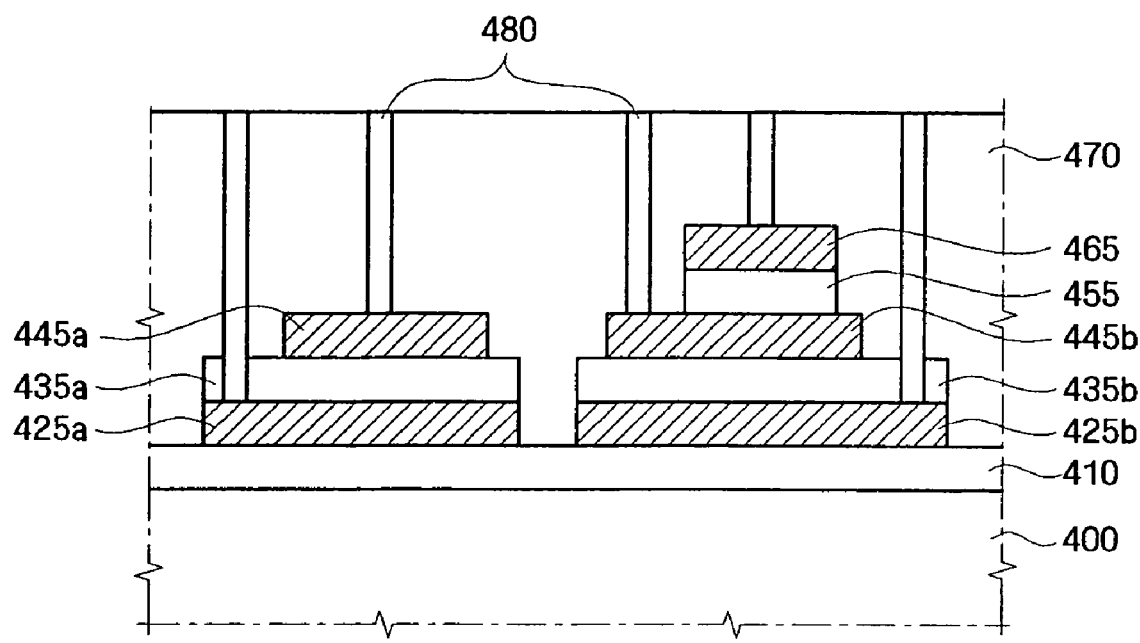

Referring to FIG. 4E, the interlayer insulating layer 470 is formed and processed using CMP, via contacts 480 are formed through the interlayer insulating layer 470, and an upper interconnect is formed on the interlayer insulating layer 470.

The first lower dielectric pattern 435a and the second lower dielectric pattern 435b can be formed of materials having dielectric properties, including SiN, Al2O3, Ta2O5, TiO, HfO2, La2O5, ZrO2, TaON, SrTiO3, (Ba, Sr)TiO3, Pb (Zr, Ti)O3, or (Pb, La) (Zr, Ti)O3. It is preferable that the upper dielectric pattern 455 is formed of a material with a relatively high dielectric constant such as silicon oxide, silicon nitride, silicon nitric oxide, aluminum nitride, aluminum nitric oxide, and metal oxide. As the metal oxide, zirconium oxide (ZrOx), aluminum oxide (AlOx), hafnium oxide (HfOx), and lanthanum oxide (LaOx) may be used.

According to the process of the fourth embodiment, the first capacitor is formed between the first lower electrode pattern 425a and the first intermediate electrode pattern 445a, the second capacitor is formed between the second intermediate electrode pattern 445b and the upper electrode pattern 465, and the third capacitor is formed between the second lower electrode pattern 425b and the second lower electrode pattern 425b, thereby implementing the multiple MIM capacitors having different capacitances per unit area.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device including multiple metal-insulator-metal (MIM) capacitors, the method comprising:
    forming a lower interconnect in a substrate;
    forming a first dielectric layer on the lower interconnect;
    forming a first intermediate electrode pattern on the first dielectric layer overlapping with the lower interconnect, such that an entire bottom surface of the first intermediate electrode pattern abuts the first dielectric layer;
    forming a second intermediate electrode pattern on the first dielectric layer and spaced apart from the first intermediate electrode pattern in a same plane of the device as the first intermediate electrode pattern;
    forming a second dielectric pattern on the second intermediate electrode pattern; and
    forming an upper electrode pattern on the second dielectric pattern.

2. The method of claim 1, further comprising forming a capping layer pattern to cover the first intermediate electrode pattern, the second intermediate electrode pattern, and the upper electrode pattern after the operation of forming the upper electrode pattern.

3. The method of claim 1, further comprising forming a capping dielectric pattern on the first intermediate electrode pattern that is in a same plane of the device as the second dielectric pattern after the operation of forming the second intermediate electrode pattern.

4. The method of claim 1, wherein a dielectric constant of the second dielectric pattern is higher than that of the first dielectric layer.

5. The method of claim 1, wherein the second dielectric pattern is formed of at least one selected material layer selected from the group consisting of a silicon oxide layer, a silicon nitride layer, a silicon nitric oxide layer, an aluminum nitride layer, an aluminum nitric oxide layer, and a metal oxide layer, and a stack of or a combination of at least one of these layers.

6. The method of claim 5, wherein the metal oxide layer comprises a zirconium oxide (ZrOx) layer, an aluminum oxide (AlOx) layer, a hafnium oxide (HfOx) layer, or a lanthanum oxide (LaOx) layer, or a combination thereof.

7. The method of claim 5, wherein the first dielectric layer is formed of SiN or AlN or of a material including SiN or AlN.

8. The method of claim 1, further comprising forming a spacer at sidewalls of the upper electrode pattern after the operation of forming the second dielectric pattern.

9. The method of claim 8, wherein the spacer is formed of SiN, SiON, SiO2, AlN, AlON, or Al2O3, or a combination thereof.

10. The method of claim 1, wherein the first intermediate electrode pattern, the second intermediate electrode pattern, and the upper electrode pattern are formed of Ti or TiN.

* * * * *

UNITED STATES PATENT AND TRADEMARK OFFICE
CERTIFICATE OF CORRECTION

PATENT NO. : 7,623,338 B2  Page 1 of 1
APPLICATION NO. : 11/343328
DATED : November 24, 2009
INVENTOR(S) : Seok-jun Won It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 620 days.

Signed and Sealed this

Twenty-sixth Day of October, 2010

David J. Kappos
*Director of the United States Patent and Trademark Office*